(12) United States Patent
Ramanjani (10) Patent No.: US 12,265,435 B2
(45) Date of Patent: Apr. 1, 2025

(54) POWER SOURCE SELECTION SYSTEMS

(71) Applicant: Hamilton Sundstrand Corporation, Charlotte, NC (US)

(72) Inventor: Shobha Ramanjani, Bangalore (IN)

(73) Assignee: Hamilton Sundstrand Corporation, Charlotte, NC (US)

( * ) Notice: Subject to any disclaimer, the term of this patent is extended or adjusted under 35 U.S.C. 154(b) by 49 days.

(21) Appl. No.: 18/128,829

(22) Filed: Mar. 30, 2023

(65) Prior Publication Data

US 2023/0333616 A1 Oct. 19, 2023

(30) Foreign Application Priority Data

Apr. 16, 2022 (IN) .............................. 202241022530

(51) Int. Cl.
| | |
|---|---|
| *G06F 1/26* | (2006.01) |
| *H03K 17/00* | (2006.01) |
| *H03K 17/693* | (2006.01) |
| *H03K 17/76* | (2006.01) |

(52) U.S. Cl.
CPC ........... *G06F 1/263* (2013.01); *H03K 17/005* (2013.01); *H03K 17/693* (2013.01); *H03K 17/76* (2013.01)

(58) Field of Classification Search
CPC .... G06F 1/263; H03K 17/005; H03K 17/693; H03K 17/76
See application file for complete search history.

(56) References Cited

U.S. PATENT DOCUMENTS

| | | |
|---|---|---|
| 4,342,922 A | 8/1982 | DiMassimo et al. |
| 4,441,031 A | 4/1984 | Moriya et al. |
| | (Continued) | |

FOREIGN PATENT DOCUMENTS

| | | |
|---|---|---|
| GB | 2298061 A | 8/1996 |

OTHER PUBLICATIONS

Extended European Search Report issued in Application No. 23167720.4 dated Oct. 2, 2023.

*Primary Examiner* — Nimesh G Patel (57) ABSTRACT

A power source selection system can include a primary source line configured to be connected to a primary source having a primary voltage, a backup source line configured to connect to a backup source having a backup voltage, and a voltage divider and limiter connected to the primary source line to receive the primary voltage and to provide an sense signal on a sense line. The system can include a NAND gate connected to the voltage divider and limiter to receive the sense signal. The NAND gate can be configured to provide a gate signal to a gate line based on the sense signal. The system can include a switchover circuit connected to the backup source line and the gate line to receive the backup voltage and the gate signal. The switchover circuit can be configured to output the backup voltage to a switch line in a first state, and to prevent backup voltage to the switch line in a second state. The switchover circuit can be configured to switch between the first state and the second state based on the gate signal. The system can include an ORing circuit connected to the primary source line and to the switch line. The ORing circuit can be configured to select between the primary voltage and backup voltage and to output the selected voltage as the output voltage.

19 Claims, 5 Drawing Sheets

(56) References Cited

U.S. PATENT DOCUMENTS

| | | | |
|---|---|---|---|
| 4,528,459 A * | 7/1985 | Wiegel | H02J 9/061 |
| | | | 307/66 |
| 4,733,107 A | 3/1988 | O'Shaughnessy et al. | |
| 5,510,735 A | 4/1996 | Mahabadi | |
| 5,734,204 A | 3/1998 | Sobue | |
| 9,729,145 B2 | 8/2017 | Sbuell | |
| 10,452,113 B2 | 10/2019 | Au Yeung et al. | |
| 2004/0160330 A1* | 8/2004 | McClure | G11C 5/141 |
| | | | 340/663 |
| 2005/0127979 A1 | 6/2005 | Fan et al. | |
| 2008/0164759 A1* | 7/2008 | Sharma | H02J 1/10 |
| | | | 307/52 |
| 2014/0001861 A1* | 1/2014 | Mann | H03K 17/62 |
| | | | 307/64 |
| 2016/0226302 A1* | 8/2016 | Zhang | H02J 9/061 |
| 2019/0101951 A1* | 4/2019 | Sather | H01M 10/0585 |

* cited by examiner

POWER SOURCE SELECTION SYSTEMS

CROSS-REFERENCE TO RELATED APPLICATIONS

This application claims priority to Indian Provisional Patent Application No. 202241022530, filed Apr. 16, 2022, the disclosure of which is incorporated by reference herein in its entirety.

FIELD

This disclosure relates to power source selection systems (e.g., for backup power selection in circuits).

BACKGROUND

Certain electronic circuits work with redundant power sources as certain circuits need an uninterrupted power supply. Such circuits can be supplied with two supplies; primary and backup for example. One source among these two with sufficient voltage can be connected to the load. Such configuration requires a power source selector circuit, to monitor the primary voltage. With any drop or interrupt in this source, the load needs to be disconnected from the primary source, and be connected to the backup source as quickly as possible. Certain applications also require not only fast operation, but to do so within certain temperature ranges. Conventional systems are expensive and/or are not suitable for desired response time and operating temperature range.

Such conventional methods and systems have generally been considered satisfactory for their intended purpose. However, there is still a need in the art for improved power source selection systems. The present disclosure provides a solution for this need.

SUMMARY

A power source selection system can include a primary source line configured to be connected to a primary source having a primary voltage, a backup source line configured to connect to a backup source having a backup voltage, and a voltage divider and limiter connected to the primary source line to receive the primary voltage and to provide a sense signal on a sense line. The system can include a NAND gate connected to the voltage divider and limiter to receive the sense signal. The NAND gate can be configured to provide a gate signal to a gate line based on the sense signal. The system can include a switchover circuit connected to the backup source line and the gate line to receive the backup voltage and the gate signal. The switchover circuit can be configured to output the backup voltage to a switch line in a first state, and to prevent backup voltage to the switch line in a second state. The switchover circuit can be configured to switch between the first state and the second state based on the gate signal. The system can include an ORing circuit connected to the primary source line and to the switch line. The ORing circuit can be configured to select between the primary voltage and backup voltage and to output the selected voltage as the output voltage.

In certain embodiments, the NAND gate can be a Schmitt trigger NAND gate. Any other suitable gate is contemplated herein. In certain embodiments, a reaction time of the system can be about 3.1 microseconds. Any other suitable reaction time is contemplated herein.

The NAND gate can have a first input and a second input. The first input of the NAND gate can be connected to the sense line and the second input can be connected to a voltage supply line configured to connect to a supply voltage Vdd. In certain embodiments, the gate signal can be high when the sense signal is low, and low when the sense signal is high.

In certain embodiments, the voltage divider and limiter can be configured to output a sense voltage in a first state, and to output a low signal in a second state when the primary voltage is at or below a set low primary threshold. The backup voltage can be selected to be a higher voltage than the primary voltage.

In certain embodiments, the voltage divider and limiter can include a first resistor having a first resistance R1 and connected to the supply voltage Vdd, and a second resistor having a second resistance R2 and connected to the first resistor. The second resistor can be connected to ground. The voltage divider and limiter can also include a third resistor having a third resistance and connected to the primary voltage input line and a fourth resistor having a fourth resistance and connected to the third resistor. The fourth resistor can be connected to ground and the sense line can be connected between the third resistor and the fourth resistor, for example.

The voltage divider and limiter can include a divider switch having a base, emitter, and collector. The base can be connected between the first resistor and the second resistor, the emitter can be connected between the third resistor and fourth resistor, and the collector can be connected to ground.

The voltage divider and limiter can be configured such that if a voltage between the first and second resistor is less than a voltage between the third and fourth resistor, the divider switch connects the voltage between first resistor and second resistor to sense signal, thereby making the sense signal high and causing the NAND gate to output a low gate signal.

The switchover circuit can include a first switch. The gate line can be connected to a first switch gate of the first switch to control a state of the first switch. The switchover circuit can include a second switch connected between the backup source line and the switch line. The first switch can be connected between ground and a second switch gate of the second switch via a second switch gate line such that the state of the first switch controls a state of the second switch.

The first switch can be configured to close when the gate signal is high to pull a second switch gate voltage low. The second switch can be configured to close when the second switch gate voltage is pulled low to connect the backup voltage to the ORing circuit. The switchover circuit can further include one or more resistors on the second switch gate line between the first switch and the second switch gate.

The switchover circuit can further comprise one or more protection components to limit voltage to the second switch and/or the ORing circuit. The protection components can include a fifth resistor having resistance R5 and a zener diode connected in parallel between the backup source line and the second gate line. The one or more resistors include a sixth resistor having resistance R6 and a seventh resistor having resistance R7. The fifth resistor and the zener diode can be connected between the sixth resistor and the seventh resistor.

The ORing circuit can include a first diode connected between the primary source line and an output, and a second diode connected between the switch line and the output. The first and second diodes can be configured such that the line with the greater voltage is passed to the output such that the first diode cannot conduct when the backup voltage is connected through the second switch because backup voltage is always higher than the primary voltage.

The first diode and second diode can be Schottky diodes, for example. Any other suitable diode type to perform the desired function is contemplated herein. In certain embodiments, the system can be configured to operate at least with a temperature range of about −55° C. to about +125° C.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
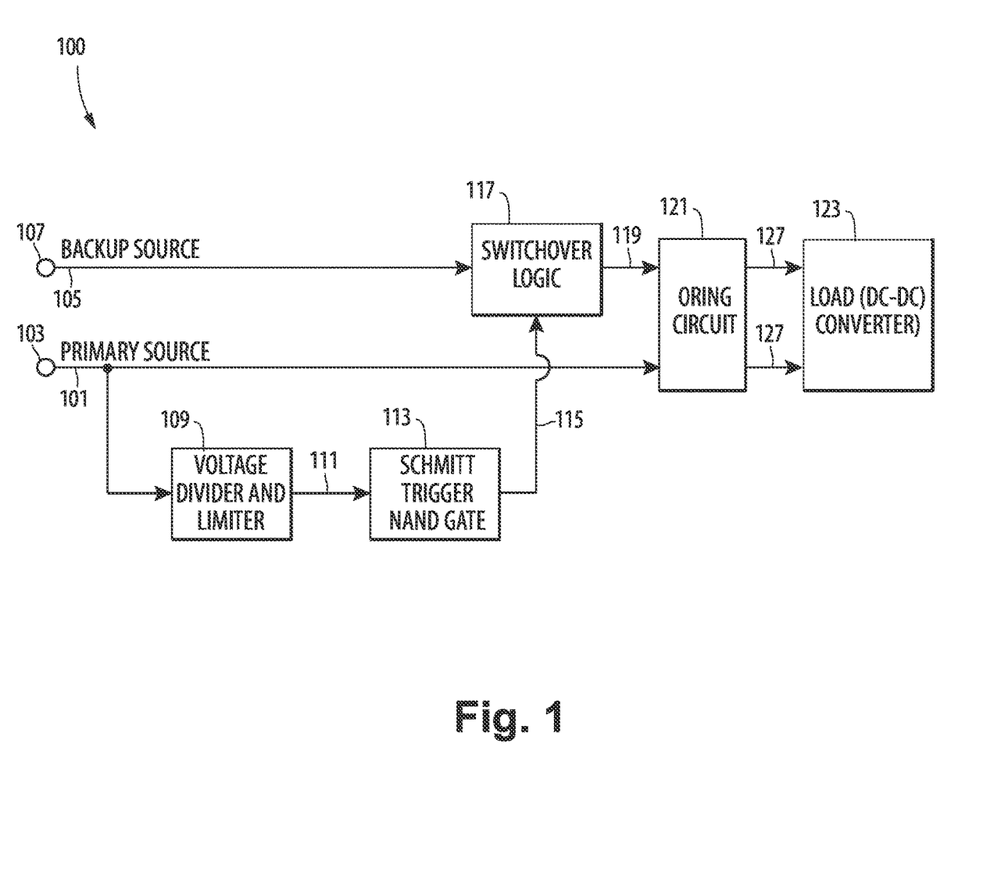
FIG. 1 is a block diagram of an embodiment of a system in accordance with this disclosure.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIGS. 2-5.

Figure 2:
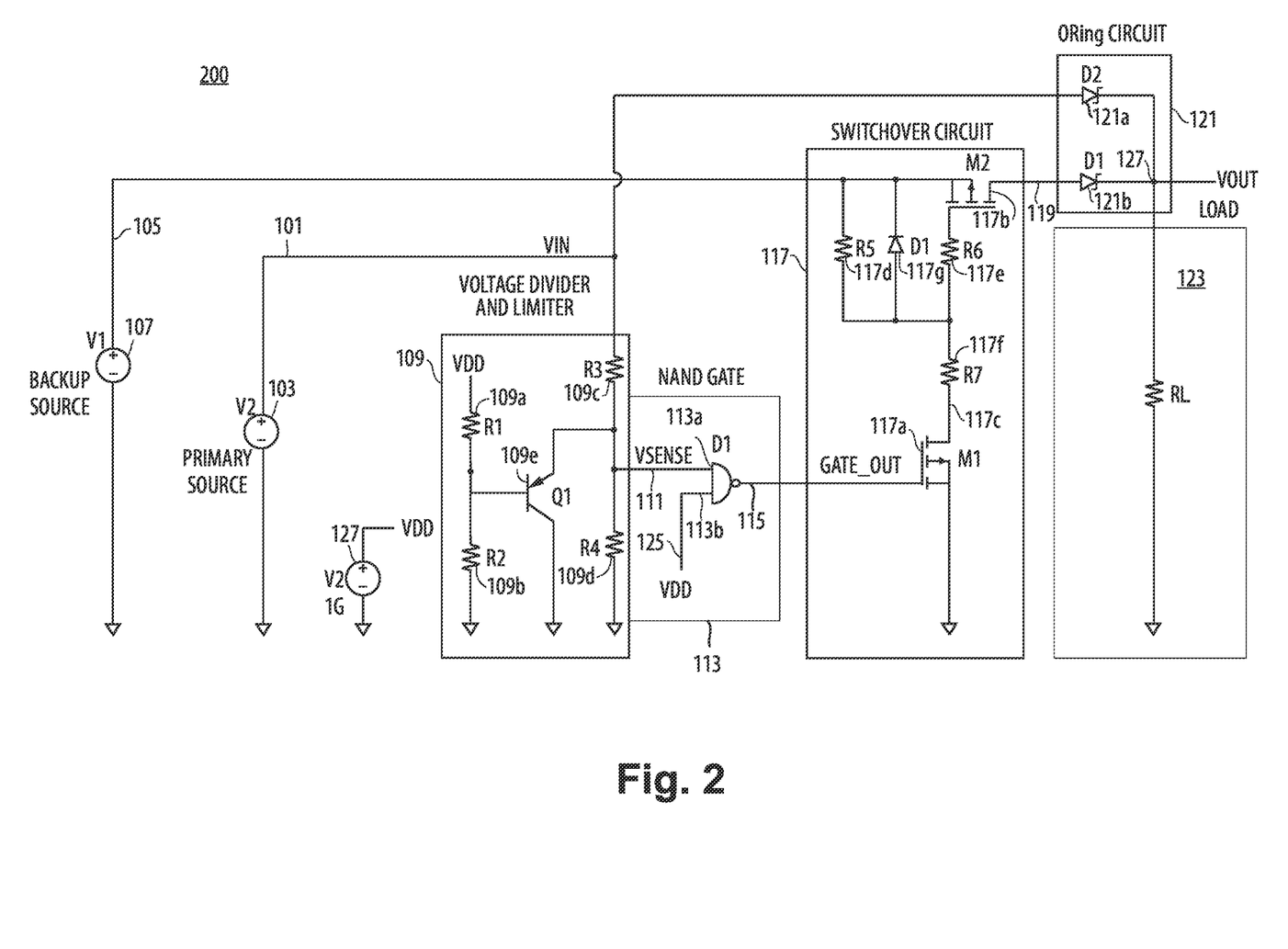
FIG. 2 is a schematic circuit diagram of an embodiment of a circuit implementation of the system of FIG. 1 in accordance with this disclosure.

Referring to FIG. 1, an embodiment of a power source selection system 100 is shown. An embodiment of a circuit implementation of the system 100 is shown in FIG. 2. Referring to FIGS. 1 and 2, the system 100 can include a primary source line 101 configured to be connected to a primary source 103 having a primary voltage (e.g., Vin as shown in FIG. 2). The system 100 can include a backup source line 105 configured to connect to a backup source 107 having a backup voltage (e.g., V1 as shown in FIG. 2).

The system 100 can include a voltage divider and limiter 109 connected to the primary source line 101 to receive the primary voltage and to provide an sense signal (e.g., Vsense as shown in FIG. 2) on a sense line 111. The system 100 can include a NAND gate 113 connected to the voltage divider and limier 109 to receive the sense signal. The NAND gate 113 can be configured to provide a gate signal (e.g., GATE_OUT as shown in FIG. 2) to a gate line 115 based on the sense signal.

The system 100 can include a switchover circuit 117 connected to the backup source line 105 and the gate line 115 to receive the backup voltage and the gate signal. The switchover circuit 117 can be configured to output the backup voltage to a switch line 119 in a first state (e.g., when on/closed), and to prevent backup voltage to the switch line 119 in a second state (e.g., when off/open). The switchover circuit 117 can be configured to switch between the first state and the second state based on the gate signal.

The system 100 can include an ORing circuit 121 connected to the primary source line 103 and to the switch line 119. The ORing circuit 121 can be configured to select between the primary voltage and backup voltage and to output the selected voltage as the output voltage (e.g., to a load 123, e.g., a DC-DC converter).

In certain embodiments, the NAND gate 113 can be a Schmitt trigger NAND gate (e.g., which can provide suitable hysteresis and fast response time in a wide temperature range). Any other suitable gate is contemplated herein. In certain embodiments, a reaction time of the system 100 can be about 3.1 microseconds (e.g., based on using components as disclosed herein, e.g., as shown in FIG. 2). Any other suitable reaction time is contemplated herein.

The NAND gate 113 can have a first input 113a and a second input 113b. The first input 113a of the NAND gate 113 can be connected to the sense line 111 and the second input 113b can be connected to a voltage supply line 125 configured to connect to a supply voltage (e.g., voltage Vdd from supply 127). In certain embodiments, the NAND gate 113 can be configured such that the gate signal is high when the sense signal is low, and low when the sense signal is high.

In certain embodiments, the voltage divider and limiter 109 can be configured to output a sense voltage (e.g., Vsense) in a first state, and to output a low signal (e.g., 0 V, ground voltage) in a second state when the primary voltage (e.g., Vin) is at or below a set low primary threshold. The backup voltage (e.g., V1) can be selected to be a higher voltage than the primary voltage (e.g., Vin), e.g., such that backup voltage is always higher than primary voltage even when full normal primary voltage is available.

In certain embodiments, the voltage divider and limiter 109 can include a first resistor 109a having a first resistance R1 and connected to the supply voltage (e.g., Vdd), and a second resistor 109b having a second resistance R2 and connected to the first resistor 109a. The second resistor 109b can be connected to ground. The voltage divider and limiter 109 can also include a third resistor 109c having a third resistance R3 and connected to the primary voltage input line 101 and a fourth resistor 109d having a fourth resistance R4 and connected to the third resistor 109c. The fourth resistor 109d can be connected to ground and the sense line 111 can be connected between the third resistor 109c and the fourth resistor 109d, for example.

The voltage divider and limiter 109 can include a divider switch 109e (e.g., a Transistor Q1) having a base, emitter, and collector. As shown, the base can be connected between the first resistor 109a and the second resistor 109b, the emitter can be connected between the third resistor 109c and fourth resistor 109d, and the collector can be connected to ground.

The voltage divider and limiter 109 can be configured such that if a voltage between the first and second resistor 109a, 109b is less than a voltage between the third and fourth resistor 109c, 109d, the divider switch 109e connects the voltage between first resistor and second resistor to sense signal, thereby making the sense signal high and causing the NAND gate 113 to output a low gate signal. For example, as the divider switch 109e, e.g., transistor Q1, collector can be tied to ground, it can connect the voltage between the first resistor and the second resistor to the $V_{SENSE}$ point. Thus when primary voltage is within a certain range, the $V_{SENSE}$ point can be high and NAND gate output can be low. In certain embodiments, when primary voltage is lower than the operating range, the $V_{SENSE}$ point can become low, that can directly make the NAND gate output high. Any other suitable circuit arrangement to cause a low sense signal at a desired primary voltage threshold and/or below said threshold is contemplated herein.

The switchover circuit 117 can include a first switch 117a (e.g., an enhancement type MOSFET M1, e.g., N-channel). The gate line 115 can be connected to a first switch gate of the first switch 117a to control a state of the first switch 117a. The switchover circuit 117 can include a second switch 117b (e.g., an enhancement type MOSFET M2, e.g., P-channel) connected between the backup source line 105 (e.g., source) and the switch line 119 (e.g., drain). The first switch 117a can be connected between ground (e.g., source) and a second switch gate (e.g., drain) of the second switch 117b via a second switch gate line 117c such that the state of the first switch 117a controls a state of the second switch 117b.

The first switch 117a can be configured to close when the gate signal is high to pull a second switch gate voltage low (e.g., by connecting the second switch gate of the second switch 117b to ground). The second switch 117b can be configured to close when the second switch gate voltage is pulled low to connect the backup voltage to the ORing circuit 121. The switchover circuit 117 can further include one or more resistors (e.g., resistors 117e, 117f) on the second switch gate line 117c between the first switch 117a and the second switch gate.

The switchover circuit 117 can further comprise one or more protection components (e.g., resistor 117d and 117g) to limit voltage to the second switch 117b and/or the ORing circuit 121. The protection components can include a fifth resistor 117d having resistance R5 and a zener diode 117g connected in parallel between the backup source line 105 and the second gate line 117c. The one or more resistors can include a sixth resistor 117e having resistance R6 and a seventh resistor 117f having resistance R7. The fifth resistor 117d and the zener diode 117g can be connected between the sixth resistor 117e and the seventh resistor 117f.

The ORing circuit 121 can include a first diode 121a connected between the primary source line 101 and an output 127, and a second diode 121b connected between the switch line 119 and the output 127. In certain embodiments, the first and second diodes 121a, b can be configured such that the line with the greater voltage is passed to the output 127 such that the first diode 121a cannot conduct when the backup voltage is connected through the second switch 117b because backup voltage can be set to always be higher than the primary voltage.

The first diode 121a and second diode 121b can be Schottky diodes, for example. Any other suitable diode type to perform the desired function is contemplated herein. In certain embodiments, the system 100 can be configured to operate at least with a temperature range of about −55° C. to about +125° C. Any suitable temperature range is contemplated herein.

As disclosed above, the backup voltage can be set at a higher voltage than the normal, set primary voltage (e.g., about 10% higher than primary voltage). The voltage divider and limier 109 can take input voltage and divide/limit the voltage, as well as provide a sense voltage to the NAND gate 113. The resistances R1 and R2 can set based on the selected value of the supply voltage Vdd (e.g., a fixed supply voltage such as 5V). The resistances R3 and R4 can be set based on a desired sense signal value to be output to the NAND gate 113.

Certain embodiments can utilize a Schmitt trigger NAND gate, which can be faster than other types of gates and has a higher range of voltage operation. The system can operate such that if voltage between R1 and R2 is greater than that between R3 and R4, the divider switch opens and connects to ground, pulling the sense signal Vsense low. The NAND gate 113 will then see a low voltage on one port and Vdd on another, and then output high signal. As appreciated by those having ordinary skill and in view of this disclosure, the NAND gate can operate such that if either input port is low, the output is high. Certain embodiments of a NAND gate 113 (e.g., the Schmitt type) can have an acceptable hysteresis that is inherent, which avoids bouncing state switching of output signal.

Embodiments of a switchover circuit 117 can include components for protection such that if the backup voltage is too high, it reduces the voltage (e.g., using a zener diode which limits voltage to a set amount). First switch 117a can be an n-channel MOSFET such that whenever the gate signal (gate_out) is high, the first switch 117a turns on. Resistance R5 can be a higher value resistor, and R6 and R7 can be low value resistors. The second switch 117b can be a p-channel MOSFET which turns on when the gate signal is low, such that when the first switch 117a turns on, the gate of the second switch 117b gets connected to ground and thus the second switch 117b turns on.

Embodiments can include an ORing circuit 121 having Schottky diodes of the same values that provide an OR logic to connect the primary voltage or the backup voltage. In certain embodiments, whenever the second switch 117b is open, the first diode 121a will not conduct, and vice versa.

Figure 3:
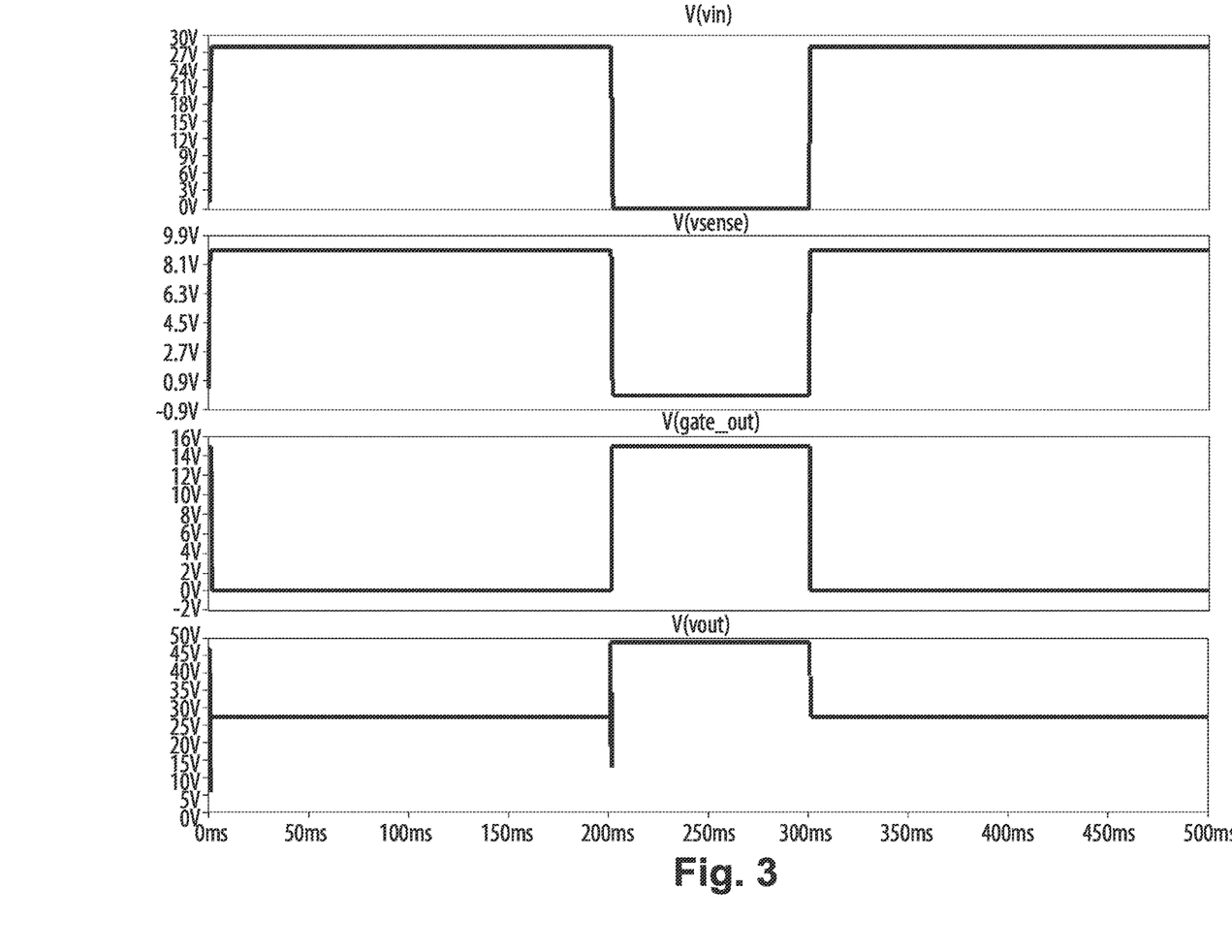
FIG. 3 is a chart illustrating circuit output of the circuit of FIG. 2 against primary voltage (shown interrupted), sense voltage, and gate voltage.
Figure 4:
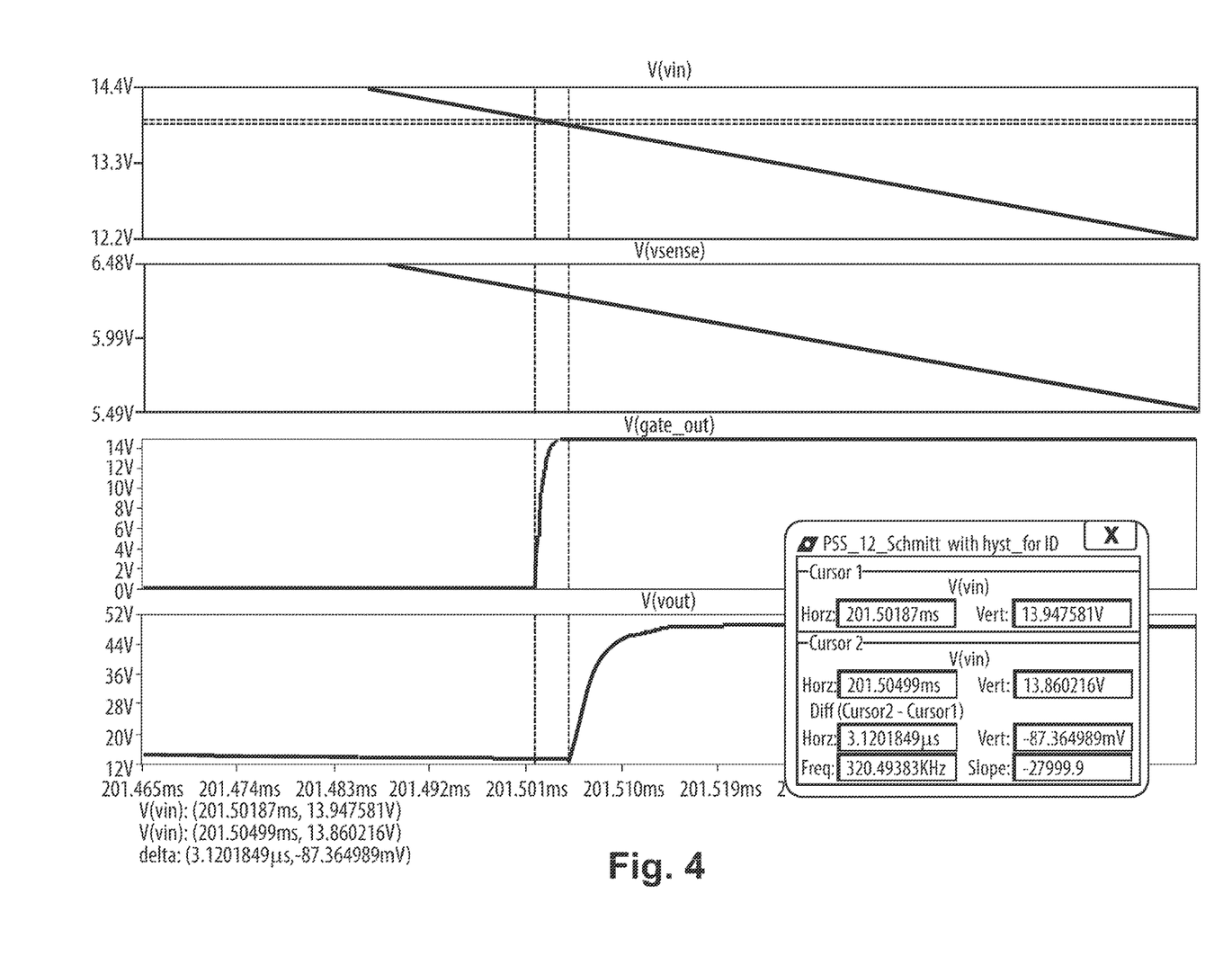
FIG. 4 is a chart illustrating response time of the circuit of FIG. 2 during a switchover from the primary source to the backup source.
Figure 5:
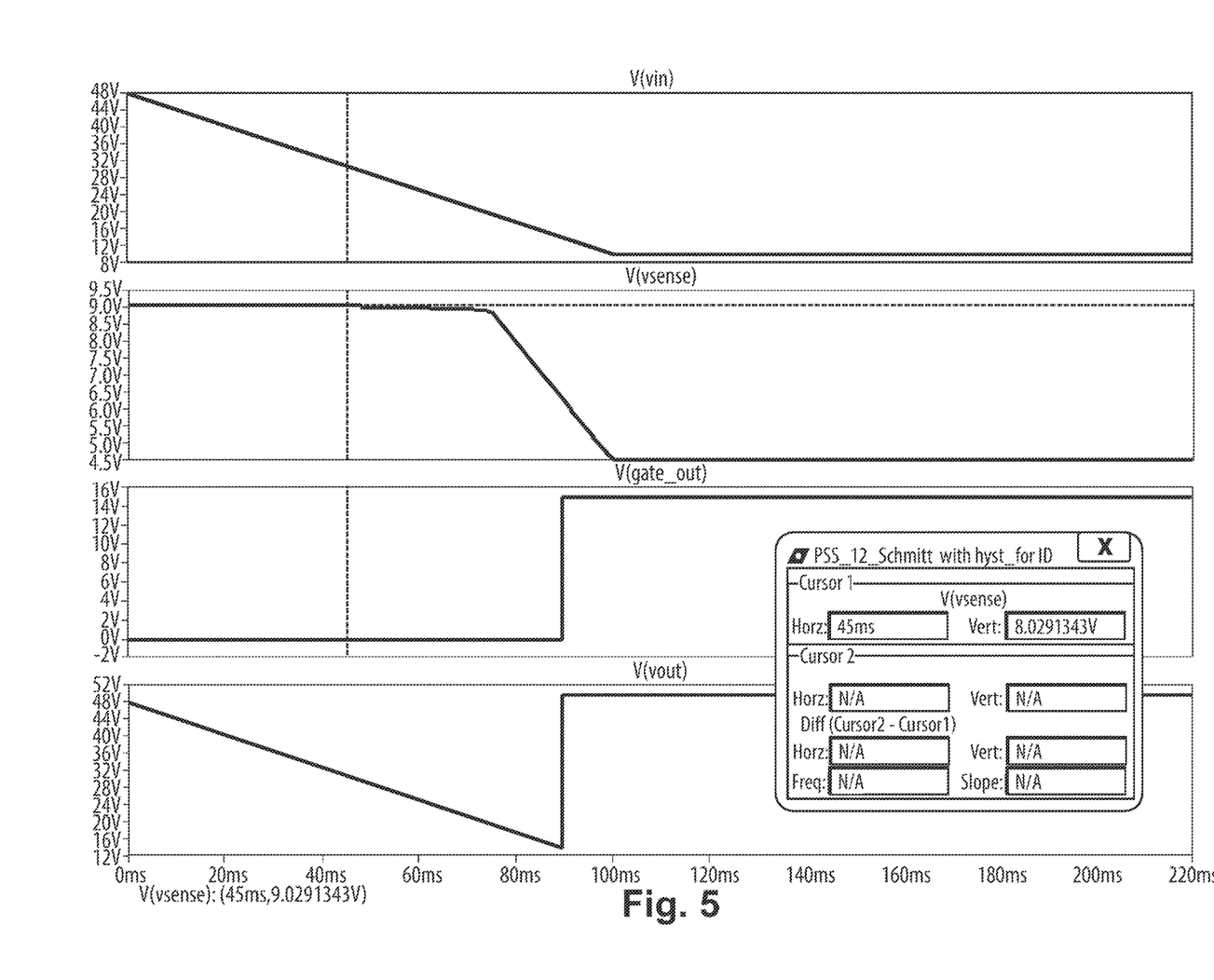
FIG. 5 is a chart illustrating the input voltage attenuated at the gate input to be limited to a high voltage threshold (e.g., 9V as shown).

FIG. 3 is a chart illustrating circuit output of an embodiment of the circuit of FIG. 2 against primary voltage (shown interrupted), sense voltage, and gate voltage. FIG. 4 is a chart illustrating response time of an embodiment of the circuit of FIG. 2 during a switchover from the primary source to the backup source. FIG. 5 is a chart illustrating the input voltage attenuated at the gate input to be limited to a high voltage threshold (e.g., 9V as shown).

Embodiments can provide a power source selection switching architecture. Embodiments can provide a simplified power source selection switching architecture with faster, and smooth response time with less complexity that cannot be achieved by any existing schemes. Embodiments can use a NAND gate Schmitt trigger with some passive elements to monitor, and detect the primary voltage drops or interrupts, and provide faster response in controlling the switch between backup power source, and the load. Embodiments can switch over the supply to the load from primary to backup. The time taken in switching over the source, and connecting the healthy power source to the load is within 3 to 4 microseconds in certain embodiments, and does not create any break in the supply to the load. Embodiments can provide a simple, inexpensive, and fast architecture without and attenuator, comparator, or any microprocessor.

Embodiments can provide a faster response time, e.g., as low as 3 microseconds with detection time of about 1 microsecond. Embodiments do not require any high end devices like an attenuator or comparator. Embodiments do not require a reference generator, and associated complexity. Embodiments can utilize a programmable fixed high voltage threshold with input voltage attenuation. Embodiments can be a relatively simple circuit with fewer components. Embodiments can provide even better response times and tight tolerance achievable with TTL devices. Embodiments can be used for any voltage source selection (e.g., in aircraft systems for DC to DC converters, or for any other suitable use in any suitable type of system). Certain embodiments are capable of operating between −55° C. to 125° C. ambient.

Power source is an essential element for the operation of all electronic circuits or systems. These electronic systems are supplied by the required power source such as AC supplies, DC supplies and batteries etc. There is always a possibility that, these power sources will interrupt or drops below the operating supply voltage range of systems due to many external and internal factors such as faults and switching over of mains supplies etc. Many electronics systems consist of processors, controllers, FPGAs, and require uninterrupted power. Sometimes the function of the system is critical for safety and reliability, and it is expected to function properly even when there is an interrupt in the power source.

Hence, many electronic systems (e.g., in aircraft) will be supplied by a redundant power source, e.g., at least two sources. One is the primary source used for entire operation of the system, except if there are any malfunctions or interruptions in this power source. The other one is a usually a backup source used only when there is an interrupt or drop in the primary source. The backup sources can be batteries, high voltage storage capacitors, or boost converters with storage capacitors, for example.

With redundant power supply configurations, there is a need for automatic power source selection circuitry, through which the primary power source will be monitored and if there are any interrupts or drop from the specified voltage range, the circuit disconnects the load or system from the primary source and makes a connection between backup source and the load. Such circuitry must also be configured to connect back to the primary source once it recovers. Such circuits can work for the required duration from the backup power source or until the primary source recovers, depending on the system requirement. The power source selector circuit should be able to automatically provide the proper power source to the load.

There are various ways the power source selection circuit can be implemented. The conventional approaches are use of mechanical relays to switch over for connecting the backup source in the event of primary power source interruption. Simple diode ORing techniques at the output of each supply with common cathode point connected to the load, this is used when there is a fixed voltage sources and any one diode conducts at a time. The voltage monitoring circuit with semiconductor switches used to switch over among these power sources. Some of the modern techniques use microcontrollers or processors to do this switch over operation based on the requirement, also there are couple of power source selector ICs such as power path controllers available can be used as standalone solution. Each of these approaches has their own merits and demerits and can be chosen based on the requirement.

There are various challenges in implementing the power source selection circuit, faster way of detection and source selection with the defined criteria without breaking the power to the load is important in the event of power failure. As stated, the main challenges in the power source selection are faster detection of source voltage variations, switchover the power source to the load without breaking supply to the load and achieving faster response without complicated and expensive solutions (and doing all of the above within a wide temperature range as well).

Embodiments provide simplified power source selection switching with faster response time and reduced cost. The proposed concept is can be applied to a 28V DC aircraft supply as a primary supply and a backup supply generated by a boost converter with holdup time of up to 200 ms. As safety and reliability is most significant in aircraft systems, 28V DC system is characterized with its own interrupts, sags, spikes etc. And the systems operated by this 28 VDC supply should be functional without any malfunction even during interrupts for the safer operation of the system, most of the aircraft sub-systems will have power source selection circuit incorporated. The proposed concept can be used for any other power sources, where there is a need of source selection.

There are various traditional techniques used for power source selection such as comparator based source selector, power source selection ICs, diode/FET ORing based source selector, or microcontroller based source selector. The circuit topologies used for power source selection with the above mentioned techniques is described further with an example of 28V DC source as a primary power source and boost converter with storage capability as a backup source for reference.

A comparator based source selector is the mostly used technique. The primary voltage will be attenuated to the lower voltage levels that can be accepted by the voltage sense circuit usually a comparator circuit. The comparator monitors the attenuated primary source input voltage for the specified threshold levels. If the power source voltage drops down the specified threshold level, the comparator output turns ON. The comparator output is connected to the switch selector circuit, which controls the semiconductor switch between backup source and load. The switch selector circuit provides make and break of connections between backup source and the load based on the comparator output. However, the primary source will supply the load once it recovers and within the specified operating range. This operation will continue to provide supply to the load without any interruption. There are limitations of such comparator based power source selection techniques. For example, the attenuator and comparator available are bandwidth limited with operating temperature range and might not meet the required operating temperature range of −55 C to +125 C. Also the cost of the available fewer devices with higher bandwidth is too expensive and increases the circuit cost. The voltage sensor or comparator needs precise reference voltage regulator circuit. A low voltage generation circuit or regulator is required to power the power source selector circuit as the source voltages are high will not meet the low voltage supply requirement of the circuit. The whole circuit becomes complex to implement the required functionality.

Power source selection ICs use a power path controller IC for the power source selection. There are only a few ICs available especially for high input voltage source selection. These ICs having separate input and sense pin to monitors the primary voltage, if this voltage below the backup voltage then pull down the gate output, that can be used to drive a P-Channel MOSFET connected in series with power source. These ICs provides automatic switching between fixed voltage ranges when primary source is slightly less than the backup source. The specified input voltage range for both primary and backup voltage are not of a wide range, also delay in switching will be in the range of 200 us to 300 us which is usually turn-on time of the MOSFET. Also the available ICs operating temperature is limited to −40 C to +125 C would not meet the required temperature range. This type of system also has limitations. For example, systems require sensing using resistor with PWM output. Input voltage is limited to a fixed voltage and these devices are not specified with wide range of voltage input. The delay in switching is in the hundreds of microsecond's range, and the available devices are temperature limited to within −40 C to +125 C.

Diode/FET ORing based source selectors are used to connect multiple voltage sources to the load by selecting the voltage source with sufficient voltage and disconnect the one which has insufficient voltage. This is simplest way of power source selection but cannot be used when a fixed voltage backup supply with higher voltage than the primary power source. The diode based ORing technique has much power dissipation based on load current and that can be replaced by the FET based ORing with an additional FET ORing controllers. This adds an additional circuit also, and this option cannot be used where the backup voltage is higher than primary voltage. Also there are not many ORing controllers available in the required temperature range.

Microcontroller based source selectors are used for high end applications where monitoring and detection of voltage, current and faults of the primary source and switching over between primary and backup source is required, mainly for systems with critical functions. Also when there is a need to switch the power source only between the specified thresholds where low and high voltage thresholds to be detected and load to be connected to the right power source. The circuit usually consists of the primary power source monitoring and detection circuitry which monitors voltage, current and any faults. The detected signal is provided to the microcontroller or microprocessor. The controller generates an output that will be connected to the output switch over logic to change the load connection from primary to backup source vice versa. This method is used for fast detection and smooth power source switching requirements, where voltage thresholds and hysteresis can be programmed as required. This is expensive also needs a standalone controller to achieve the required functionality. This type of system also has limitations. This method makes the circuit more complex, and implementation and sustaining of circuitry is also complex. Also, this method is an expensive solution that increases the cost of the circuit.

All the traditional techniques used for current sensing have challenges and limitations. Certain embodiments disclosed provide architecture for the power source selection which is simple, accurate with faster detection time and smooth response. Embodiments can be based on 28V aircraft supply as primary source and a backup source is derived through a boost converter supplied through the same 28V aircraft supply with slightly higher output voltage than the maximum primary voltage range having variable holdup time. This concept can be used for any power source with DC input and AC input voltage where redundant supplies are used for safer operation.

An embodiment of the proposed solution is shown in FIG. 1 and has been verified with simulation as further described below. Embodiments of a circuit can include of a voltage divider and limiter network connected from the primary supply, a CMOS two input Schmitt trigger NAND Gate, a switchover circuit with P, and N channel MOSFET and a set of schottky diodes ORing circuit at the output of primary and backup source. The voltage divider network and limiter network can be a simple resistive divider networks with a high voltage threshold limiting switch is connected from the primary power source input. This circuit can scale down the primary voltage and also provides attenuations at higher input voltage by regulating this to a required high level threshold. Embodiments can use a CMOS two input Schmitt trigger NAND gate, which can be configured to work as input voltage sensor and a low voltage threshold detector through the negative threshold range specified for the NAND gate.

The voltage divider and limiter output can be connected to the one input of the NAND gate to sense the primary voltage through this network. The other input of the NAND gate can be tied to HIGH by connecting to VDD voltage which is the specified high VDD range. The voltage divider network resistors can be selected in such a way that the NAND gate input voltage will reach the specified negative threshold range of the gate, which is close to the specified low voltage operating range of the load supplied by primary source. The LOW input on the NAND gate can turn the output ON by providing the HIGH output.

This HIGH output from the NAND gate can then turn ON the N-channel MOSFET connected at the output. The turning ON of the N-channel MOSFET can pull down the gate of the P-channel MOSFET connected in series with the backup source. This can then turn ON the P-channel MOSFET and applies the backup voltage to the anode of the diode (of the ORing circuit) connected between load and the backup source, and the diode can then start conducting.

In certain embodiments, as the backup supply range can always be more than the specified maximum voltage range of the primary source, the diode connected between primary source and the load will see the voltage which is less than the backup voltage and will stop conducting. With this combination of ORing diodes, the primary source connected to the load will get disconnected and the backup source connects to the load.

The NAND gate can trigger the input voltage drop and turn ON the output with the propagation delay specified for the NAND Schmitt trigger (which is approximately 1 microsecond). This can be even reduced based on the logic gate device selection, for example.

Once the primary voltage levels come back to the required high voltage threshold, the load can disconnect from the backup source and connects back to the primary source. The high voltage threshold level can be been set externally through a PNP transistor with a divider network, if the input voltage is more than the PNP transistor base voltage by one diode drop, it will set the NAND gate input to a positive threshold level and turn OFF the gate output, for example. Through this, the hysteresis can be made independent of NAND gate positive threshold levels.

In embodiments, the NAND gate output turning OFF will immediately switch over to connect the primary source to the load by disconnecting backup source. Delay associated with this includes the propagation delay and associated circuit delays. The circuit can be designed to operate with a hysteresis of 5V, and this can be acceptable for such circuits where input voltage range is up to 50V, for example. However, with the use of low level VDD (e.g., 5V as described above) and with TTL (transitor-transistor logic) based logic devices, a smaller hysteresis can be achieved and used. Overall circuitry can work with smaller propagation delay and there will not be any break in the power supply for operation of the load circuitry. When the voltage drops below the threshold, the backup circuitry can connect to the load within microseconds time, before the input voltage reaches its lower operating voltage range of the load, and the load then functions continuously.

In embodiments, the circuitry can be simple. For example, the voltage detection and switch control can be through simple CMOS logic gate easily available with a desired operating temperature range. In embodiments, there is no need of generating precision reference voltages as needed for comparator circuits, where bandwidth is limited. Also there is no need of smaller VCC generation, as this CMOS gates works with even 15V DC and a regulator from the primary source provides this VDD to the circuitry.

In embodiments, there is no need for attenuators as the divider and limiter circuit can limit the input voltage at gate input irrespective of input voltage variations. This eliminates most of the stages from the traditional circuitry such as attenuator, comparator and precision reference generator circuit.

In embodiments, the response time in identifying the fault and controlling the function is very small. In embodiments, all the circuit components can be selected to be operational for the temperature range of −55° C. to +125° C.

FIG. 2 shows a proposed circuit schematic. Below described is a simulation of an embodiment of the circuit of FIG. 2. The circuit is simulated with 28V DC supply as primary supply which varies from 12V to 48V and backup source of 50V DC with hold up time up to 200 ms. Schmitt trigger NAND gate input is fed from the 28V DC supply through voltage divider and limiter circuit and output is connected to a fast response switchover circuit consist of N-Channel, and P-Channel MOSFET is in series with backup supply and each source connected to load through a schottky diode as shown in FIG. 2. The primary voltage less than 14V will make NAND gate output as HIGH and switches ON both the MOSFETs and creates a path between backup source and load, as soon as the backup source is connected to anode of the diode and starts conducting in the ORing circuit, the load will get disconnect from the primary source from the load and this will continue until the primary voltage recovers to its high voltage threshold level which makes NAND gate output as LOW and switches OFF both the MOSFETs. The time taken to detect the voltage fault and to provide the output is within 1 us and overall switchover from one supply to other supply will be about 3 us. This circuit configuration will not allow the output voltage to fall below the minimum operating voltage range by continuously providing the voltage to the load by immediately switching over from fault source to backup source.

FIG. 3 shows the circuit output with interrupted primary source. The 28V DC (Vin) input voltage is interrupted and drops down to zero for a while, the load will be applied with the backup source (Vout) voltage without breaking the supply voltage to the load and load will operate with this backup voltage until the primary voltage recovers. Once the primary voltage recovers and rises to the set high level threshold voltage, the load will be disconnected from the back up supply and immediately connects to the primary voltage.

FIG. 4 shows the switchover from primary source to backup source. The delay in-between switching over, from make and break will not impact on the voltage applied to the load as the overall delay in switch over from primary to backup is about 3 us as shown in FIG. 4 and load will be applied with the operating voltage range always.

FIG. 5 shows the input voltage attenuated at the gate input. The voltage is limited to maximum 9V irrespective of input voltage variations at the input of the NAND gate as shown in FIG. 5 as the primary voltage varies up to 48V. Simple voltage limiter circuit with a transistor and a divider network achieve this attenuation, even sets the high voltage threshold of the NAND gate by setting this voltage to 9V (Positive threshold of NAND gate), when the input voltage (Vin) reaches to 19V.

All the components selected are of −55° C. to 125° C. operational temperature range, and the simulated circuit takes worst case maximum 3 us in selecting the switchover between sources. This switchover can be still reduced further by using TTL based NAND gates with less propagation delays.

Comparing embodiments to traditional systems, the comparator based systems are bandwidth limited and complicated. A fast response time can be achieved only by selection of high end devices of higher bandwidth which are expensive. Microprocessor based topologies are useful only for system critical application and overall faults of power source supposed to be detected, and a standalone microprocessor is necessary to achieve faster response and continuous monitoring of power source. Power path controller ICs provide a cost effective solution, but with slow response time, and are also limited to narrower operating temperature range and input voltage range.

Embodiments using a NAND gate based power source selection architecture makes use of inexpensive digital solutions, which are available easily with higher bandwidth. Response time achieved through this concept can be fastest compared all the other options, comparatively with less price and less complexity. Embodiments can also be constructed to work for a −55° C. to 125° C. temperature range. Embodiments can provide a worst case response time of about 3 microseconds, do not utilize a microprocessor or high end devices, provide a suitably wide temperature operating range (e.g., −55 C to 125 C), and cost the least out of any traditional solution.

While embodiments of components are disclosure above, one or more of the circuit components can be implemented using any other suitable hardware and/or software modules where suitable results are achieved. Embodiments can include any suitable computer hardware and/or software module(s) to perform any suitable function (e.g., as disclosed herein). Additionally, any other suitable modules for communication with the system and/or one or more components are contemplated herein.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A power source selection system, comprising:
   a primary source line configured to be connected to a primary source having a primary voltage;
   a backup source line configured to be connected to a backup source having a backup voltage;
   a voltage divider and limiter connected to the primary source line to receive the primary voltage and to provide a sense signal on a sense line;
   a NAND gate including a first input connected to the sense line to receive the sense signal and a second input connected to a voltage supply line configured to connect to a supply voltage, wherein the NAND gate is configured to provide a gate signal to a gate line based on the sense signal;
   a switchover circuit connected to the backup source line and the gate line to receive the backup voltage and the gate signal, wherein the switchover circuit is configured to output the backup voltage to a switch line in a first state and to block the backup voltage from the switch line in a second state, and wherein the switchover circuit is configured to switch between the first state and the second state based on the gate signal; and
   an ORing circuit connected to the primary source line and to the switch line, wherein the ORing circuit is configured to select between the primary voltage and the backup voltage and to output the selected voltage as an output voltage.

2. The system of claim 1, wherein the NAND gate is a Schmitt trigger NAND gate.

3. The system of claim 2, wherein a reaction time of the system to switch between the first state and the second state is not greater than 3.1 microseconds.

4. The system of claim 1, wherein the gate signal is high when the sense signal is low, and the gate signal is low when the sense signal is high.

5. The system of claim 1, wherein the voltage divider and limiter is configured to:
   output a sense voltage in a first state; and
   output a low signal in a second state when the primary voltage is at or below a set low primary threshold.

6. The system of claim 5, wherein the backup voltage is selected to be a higher voltage than the primary voltage.

7. The system of claim 6, wherein the voltage divider and limiter includes:
   a first resistor having a first resistance and connected to the supply voltage;
   a second resistor having a second resistance and connected to the first resistor, wherein the second resistor is connected to ground;
   a third resistor having a third resistance and connected to the primary source line;
   a fourth resistor having a fourth resistance and connected to the third resistor, wherein the fourth resistor is connected to ground, wherein the sense line is connected between the third resistor and the fourth resistor; and
   a divider switch having a base, an emitter, and a collector, wherein the base is connected between the first resistor and the second resistor, the emitter is connected between the third resistor and fourth resistor, and the collector is connected to ground.

8. The system of claim 7, wherein the voltage divider and limiter is configured such that, if a voltage between the first and second resistors is less than a voltage between the third and fourth resistors, the divider switch connects the voltage between the first and second resistors to the sense signal, thereby making the sense signal high and causing the NAND gate to output a low gate signal.

9. The system of claim 8, wherein the switchover circuit includes a first switch, wherein the gate line is connected to a first switch gate of the first switch to control a state of the first switch.

10. The system of claim 9, wherein the switchover circuit includes a second switch connected between the backup source line and the switch line, wherein the first switch is connected between ground and a second switch gate of the second switch via a second switch gate line such that state of the first switch controls a state of the second switch.

11. The system of claim 10, wherein the first switch is configured to close when the gate signal is high to pull a second switch gate voltage low, wherein the second switch is configured to close when the second switch gate voltage is pulled low to connect the backup voltage to the ORing circuit.

12. The system of claim 11, wherein the switchover circuit further comprises one or more resistors on the second switch gate line between the first switch and the second switch gate.

13. The system of claim 12, wherein the switchover circuit further comprises one or more protection components configured to limit voltage to the second switch and/or the ORing circuit.

14. The system of claim 13, wherein the one or more protection components include a fifth resistor having a fifth resistance and a zener diode connected in parallel between the backup source line and the second switch gate line.

15. The system of claim 14, wherein the one or more resistors include a sixth resistor having a sixth resistance and a seventh resistor having a seventh resistance.

16. The system of claim 15, wherein the fifth resistor and the zener diode are connected between the sixth resistor and the seventh resistor.

17. The system of claim 16, wherein the ORing circuit includes (i) a first diode connected between the primary source line and an output and (ii) a second diode connected between the switch line and the output, wherein the first and second diodes are configured such that a greater voltage from the primary source line or the switch line is passed to the output such that the first diode cannot conduct when the backup voltage is connected through the second switch because the backup voltage is always higher than the primary voltage.

18. The system of claim 17, wherein the first diode and the second diode are Schottky diodes.

19. The system of claim 18, wherein the system is configured to operate at least with a temperature range of about −55° C. to about +125° C.

* * * * *